United States Patent
Wu

(10) Patent No.: US 9,110,641 B2
(45) Date of Patent: Aug. 18, 2015

(54) CONTAINER DATA CENTER

(75) Inventor: Wen-Jen Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 253 days.

(21) Appl. No.: 13/593,482

(22) Filed: Aug. 23, 2012

(65) Prior Publication Data

US 2014/0049898 A1 Feb. 20, 2014

(30) Foreign Application Priority Data

Aug. 15, 2012 (TW) .............................. 101129636 A

(51) Int. Cl.
*G06F 1/20* (2006.01)
*H05K 7/20* (2006.01)

(52) U.S. Cl.
CPC .............. *G06F 1/20* (2013.01); *H05K 7/20745* (2013.01)

(58) Field of Classification Search
CPC .............. G06F 1/20; H05K 5/02; H05K 7/20; H05K 7/29; F28F 27/00
USPC ........................ 361/679.46–679.53, 690–697, 361/724–728, 679.31, 688, 689, 698, 699; 165/104.33, 47, 48.1, 247, 121–126, 165/202, 287; 454/184; 312/223.2, 236, 312/265

See application file for complete search history.

(56) References Cited

U.S. PATENT DOCUMENTS

| 7,854,652 | B2* | 12/2010 | Yates et al. ..................... 454/184 |
| 7,903,407 | B2* | 3/2011 | Matsushima et al. ......... 361/695 |
| 7,961,463 | B2* | 6/2011 | Belady et al. .................. 361/695 |
| 8,422,223 | B2* | 4/2013 | Su et al. ......................... 361/690 |
| 8,734,212 | B2* | 5/2014 | Peng et al. ..................... 454/184 |
| 2011/0151765 | A1* | 6/2011 | Chen et al. ..................... 454/184 |
| 2012/0132554 | A1* | 5/2012 | Wei ................................ 206/320 |
| 2013/0058029 | A1* | 3/2013 | Ootani et al. ............. 361/679.31 |
| 2014/0004785 | A1* | 1/2014 | Wei ................................ 454/253 |

* cited by examiner

*Primary Examiner* — Michail V Datskovskiy
(74) *Attorney, Agent, or Firm* — Novak Druce Connolly Bove + Quigg LLP

(57) ABSTRACT

A container data center includes a container, a row of racks installed in the container, an air conditioner, and a heat insulation apparatus. A cool channel and a heat channel are defined at two opposite sides of the row of racks. The removable heat insulation apparatus divides the cool channel into a first space and a small second next to the racks, and maintains the cooled air in the second space. Cooled air from the air conditioner is fed into the second space air conditioner, flows through the racks to remove heat generated, and enters the heat channel.

8 Claims, 4 Drawing Sheets

CONTAINER DATA CENTER

BACKGROUND

1. Technical Field

The present disclosure relates to container data centers, and particularly to a container data center with a heat insulation apparatus.

2. Description of Related Art

Container data centers are centralized computing facilities that include many servers, often arranged on server racks, with several servers on one rack. In a working state, the servers generate heat in the container data centers, therefore effective heat dissipation is necessary.

The container data center generally includes a container, and a row of racks received in the container. A cool channel and a heat channel are respectively defined at two opposite sides of the row of racks. Cooled air generated by an air conditioner is forced into the cool channel of the container, flows through the racks, and enters the heat channel. From time to time, an operator needs to enter the cool channel for repairing or operating the servers, so the space for the cool channel must be spacious enough. However, large cool channel will possibly cause power waste and less effective for heat dissipation.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
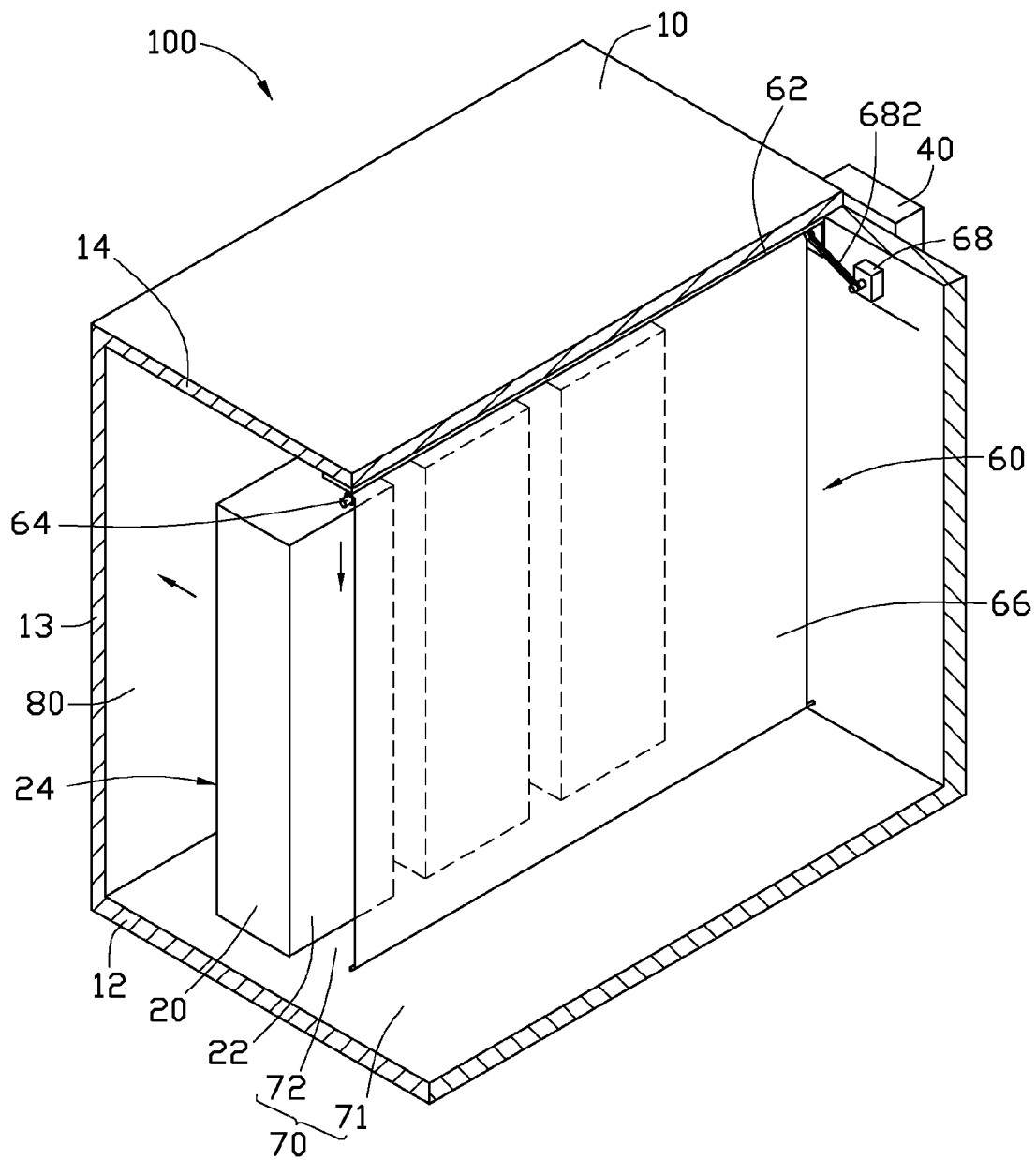
FIG. 1 is a partial, isometric view of an embodiment of a container data center, wherein the container data center includes a heat insulation apparatus.

Referring to FIG. 1, an embodiment of a container data center 100 includes a container 10, a row of racks 20 received in the container 10, an air conditioner 40 installed on the container 10, and a heat insulation apparatus 60. A cool channel 70 and a heat channel 80 are defined in the container 10, at two opposite sides of the row of racks 20.

The container 10 includes a rectangular bottom wall 12, a top wall 14 opposite to the bottom wall 12, a rear wall 13 connected between rear sides of the bottom wall 12 and the top wall 14, and a front wall 15 (shown in FIG. 3) connected between front sides of the bottom wall 12 and the top wall 14. Each rack 20 includes a front plate 22 facing the front wall 15 and a rear plate 24 facing the rear wall 13. The row of racks 20 is supported on the bottom wall 12, and parallel to the rear wall 13 and the front wall 15. The front wall 15 and the front plates 22 of the row of racks 20 cooperatively bound the cool channel 70, and the rear wall 13 and the rear plates 24 of the row of racks 20 cooperatively bound the heat channel 80. The air conditioner 40 is installed outside or on the container 10.

Figure 2:
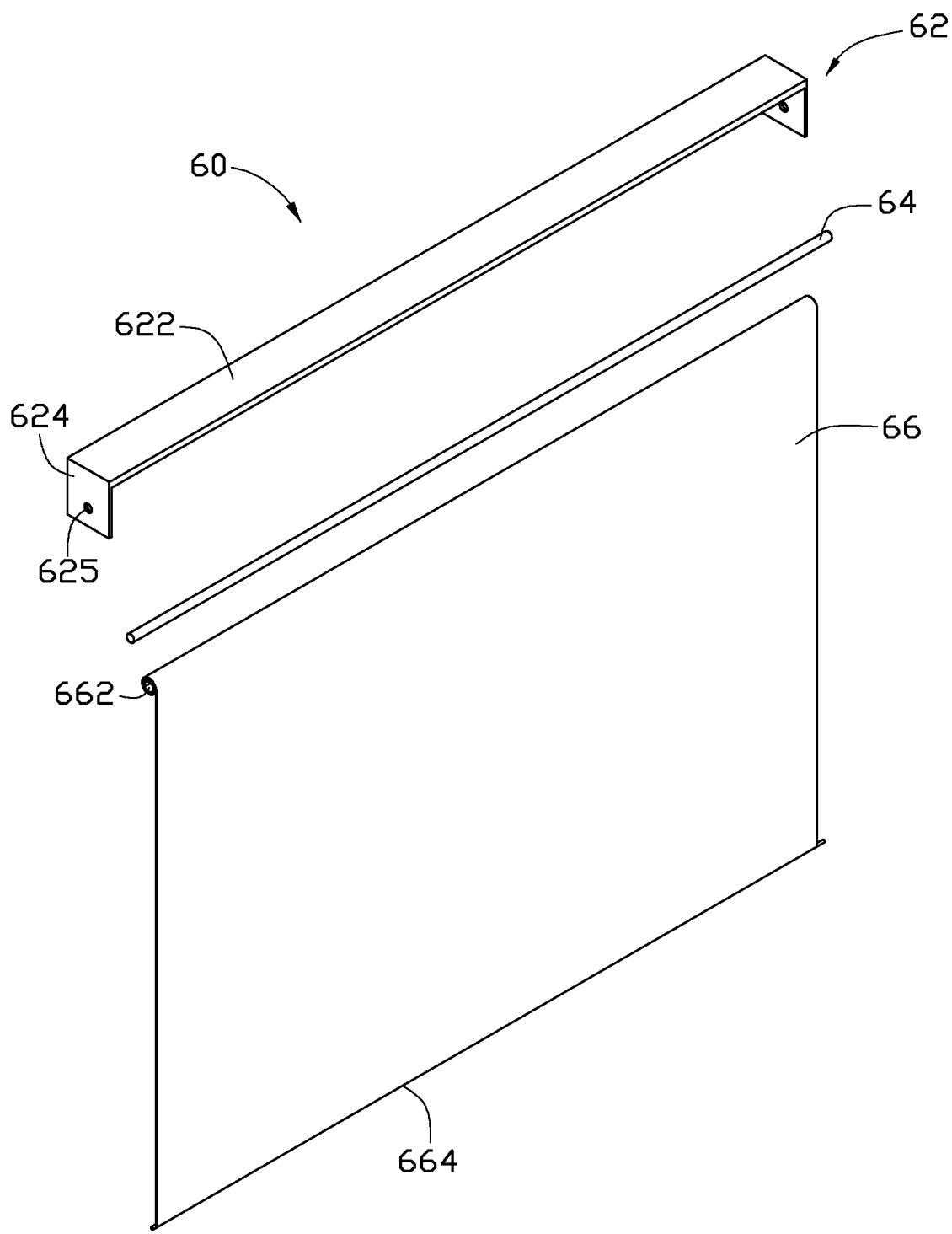
FIG. 2 is an exploded, isometric view of the heat insulation apparatus of FIG. 1.

Referring to FIG. 2, the heat insulation apparatus 60 includes a bracket 62, a shaft 64, a shield member 66, and a motor 68.

The bracket 62 includes a bar-shaped installing plate 622 and two end plates 624 extending down from two opposite ends of the installing plate 622. The installing plate 622 is fixed on an inner surface of the top wall 14 by screwing or clamping, adjacent to the front plates 22 of the row of racks 20 and parallel to the rear wall 13. The end plates 624 each define a shaft hole 625.

Two opposite ends of the shaft 64 are rotatably installed in the shaft holes 625 of the bracket 62.

The shield member 66 is planar, and made of flexible and heat insulation material. The length of the shield member 66 is greater than the length of the cool channel 70. The length of the cool channel 70 in a direction parallel to the front wall 15 equals a length of the front wall 15 and the rear wall 13. The shield member 66 includes a first side 662 fixed on the shaft 66, and a second side 664 opposite to the first side 662.

The motor 68 is fixed to the container 10. The motor 68 includes a transmission belt 682 connecting the shaft 64 and the motor 68. The motor 68 can drive the shaft 64 to rotate by means of the transmission belt 682, to allow the shield member 66 to wrap around or unwrap from the shaft 64.

Figure 3:
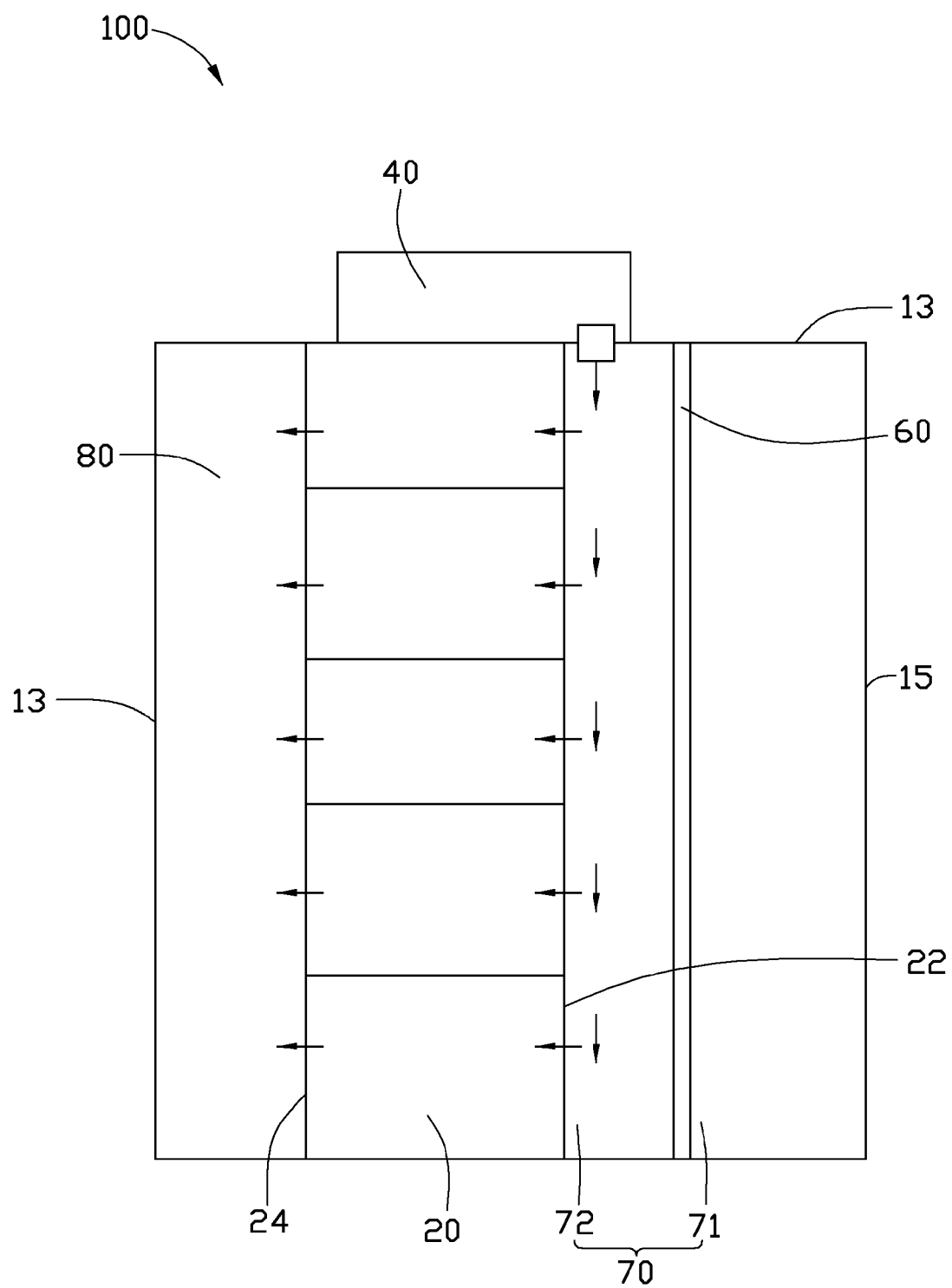
FIG. 3 is a top plan view of the container data center of FIG. 1.
Figure 4:
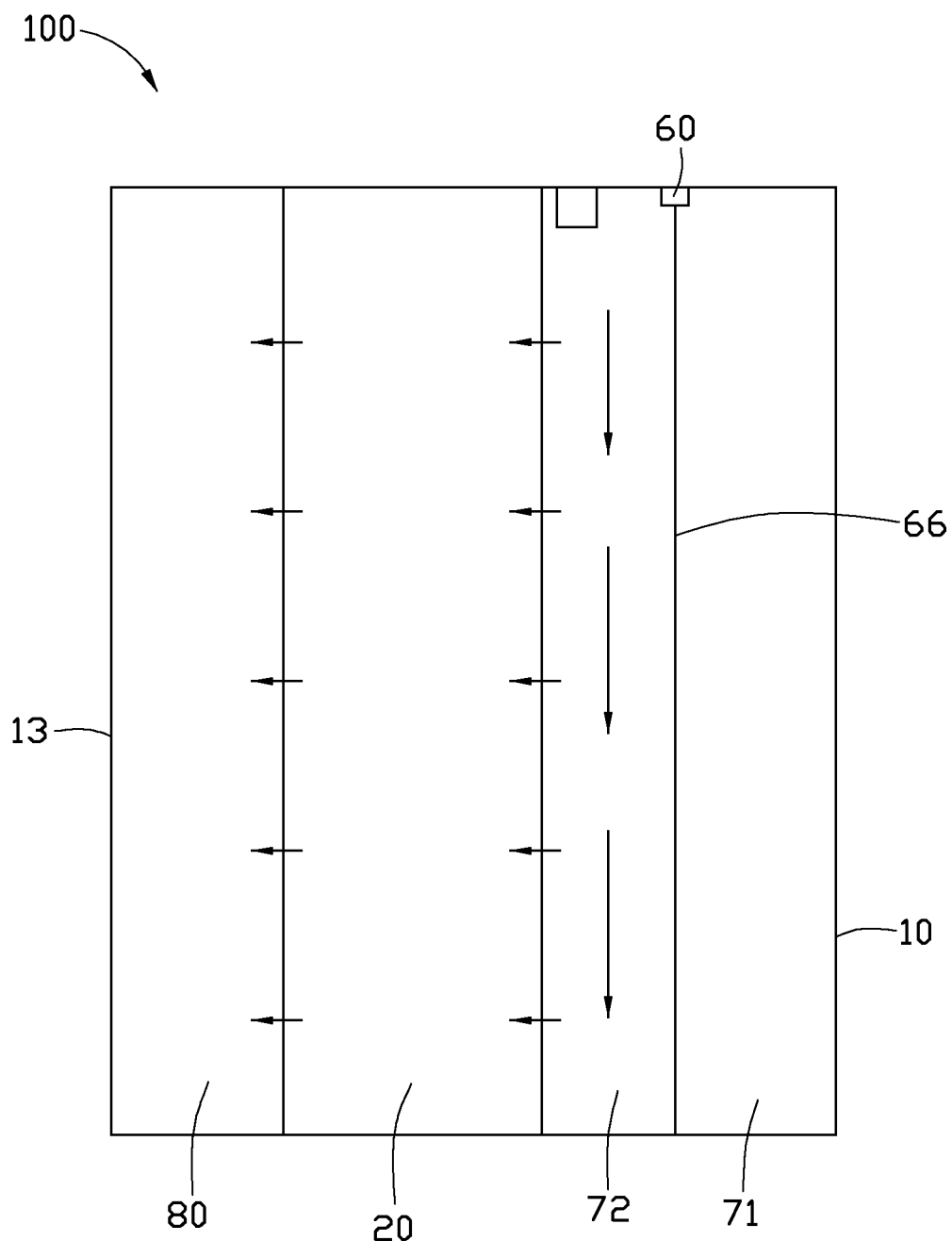
FIG. 4 is a side plan view of the container data center of FIG. 1.

Referring to FIGS. 3 and 4, in use, the motor 68 drives the shaft 64 to rotate, allowing the second side 664 of the shield member 66 to extend down, until the second side 664 abuts an inner surface of the bottom wall 12. The cool channel 70 is then divided into a first space 71 adjacent to the front wall 15 and a second space 72 adjacent to the front plates 22 of the row of racks 20. An air outlet 42 of the air conditioner 40 is located in the top portion of the second space 72. Cool air 44 generated by the air conditioner 40 is forced into the second space 72 from the top of the container 10, flows through the racks 20, and enters the heat channel 80. When an operator needs access to the interior of the container data center 100 through the cool channel 70, the motor 68 drives the shaft 64 to rotate. The shield member 66 wraps around the shaft 64 to be lifted, to make the first space 71 next to the second space 72.

According to the above-mentioned heat insulation apparatus 60, all of the cool air 44 of the air conditioner 40 is restricted to the second space 72 when the operator does not require access to the container 10, which increases heat dissipation efficiency in the container 10 and saves power.

It is to be understood, however, that even though numerous characteristics and advantages of the embodiments have been set forth in the foregoing description, together with details of the structure and function of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A container data center, comprising:
   a container;
   a row of racks received in the container, wherein a cool channel and a heat channel are defined in the container, respectively at two opposite sides of the row of racks;
   an air conditioner; and a heat insulation apparatus received in the cool channel, wherein the heat insulation apparatus is operable of dividing the cool channel into a first space away from the racks and a second space next to the racks, an air outlet of the air conditioner is located in the second space, cool air generated by the air conditioner is forced into the second space, flows through the row of racks, and enters the heat channel.

2. A container data center comprising:

a container;

a row of racks received in the container, wherein a cool channel and a heat channel are defined in the container, respectively at two opposite sides of the row of racks;

an air conditioner; and a heat insulation apparatus received in the cool channel, wherein the heat insulation apparatus is operable of dividing the cool channel into a first space away from the racks and a second space next to the racks, an air outlet of the air conditioner is located in the second space, cool air generated by the air conditioner is forced into the second space, flows through the row of racks, and enters the heat channel;

wherein the heat insulation apparatus comprises a bracket fixed to a top of the container, a shaft rotatably installed to the bracket, a motor driving the shaft to rotate, and a shield member operable to be wrapped around or unwrapped from the shaft.

3. The container data center of claim 2, wherein the shield member is made of heat insulation material, and comprises a first side fixed to the shaft, and a second side opposite to the first side and abutting a bottom of the container in response to the shield member unwrapped from the shaft to divide the cool channel into the first space and the second space.

4. The container data center of claim 2, wherein the bracket comprises an installing plate fixed on an inner surface of the container, and two end plates extending down from two opposite ends of the installing plate, the shaft is installed between the end plates.

5. The container data center of claim 4, wherein the installing plates respectively define two opposite shaft holes, two opposite ends of the shaft are rotatably installed in the shaft holes.

6. The container data center of claim 4, wherein the container comprises a bottom wall, a top wall opposite to the bottom wall, a rear wall connected between rear sides of the bottom wall and the top wall, and a front wall connected between front sides of the bottom wall and the top wall, each rack comprises a front plate facing the front wall and a rear plate facing the rear wall, the row of racks are supported on the bottom wall and parallel to the rear wall.

7. The container data center of claim 6, wherein the front wall and the front plates of the row of racks cooperatively bound the cool channel, the rear wall and the rear plates of the row of racks cooperatively bound the heat channel.

8. The container data center of claim 2, wherein the motor comprises a transmission belt coiled between the shaft and the motor, and the motor drives the shaft to rotate through the transmission belt, to allow the shield member to wrap around or unwrap from the shaft.

* * * * *